United States Patent
Peng et al.

(10) Patent No.: US 12,495,903 B2
(45) Date of Patent: Dec. 16, 2025

(54) BASE MECHANISM AND PERIPHERAL ASSEMBLY AND ELECTRONIC DEVICE INCLUDING THE SAME

(71) Applicant: WISTRON CORP., New Taipei (TW)

(72) Inventors: Shaobo Peng, New Taipei (TW); Ji Tao Li, New Taipei (TW); Yan Ping Wu, New Taipei (TW)

(73) Assignee: WISTRON CORP., New Taipei (TW)

( * ) Notice: Subject to any disclaimer, the term of this patent is extended or adjusted under 35 U.S.C. 154(b) by 433 days.

(21) Appl. No.: 18/048,048

(22) Filed: Oct. 20, 2022

(65) Prior Publication Data

US 2024/0023711 A1    Jan. 25, 2024

(30) Foreign Application Priority Data

Jul. 22, 2022    (CN) .......................... 202210865848.5

(51) Int. Cl.
  *H05K 5/02*  (2006.01)
  *A47B 97/00*  (2006.01)
  *F16B 1/00*  (2006.01)
  *F16M 13/02*  (2006.01)

(52) U.S. Cl.
  CPC ................. *A47B 97/00* (2013.01); *F16B 1/00* (2013.01); *F16M 13/022* (2013.01); *H05K 5/0204* (2013.01); *A47B 2097/005* (2013.01); *F16B 2200/83* (2023.08)

(58) Field of Classification Search
  CPC .................................................... H05K 5/0204
  See application file for complete search history.

(56) References Cited

U.S. PATENT DOCUMENTS

| | | | | |
|---|---|---|---|---|
| 7,431,253 B2 * | 10/2008 | Yeh | ......................... | F16M 13/00 248/231.51 |
| 7,618,202 B2 * | 11/2009 | Xiao | ..................... | G06F 1/1607 396/428 |
| 7,931,243 B2 * | 4/2011 | Yim | ....................... | H04R 1/026 248/231.51 |
| 10,206,522 B2 | 2/2019 | Yang et al. | | |
| 11,556,147 B2 * | 1/2023 | Rizvi | ................. | F16M 11/2021 |
| 11,789,490 B2 * | 10/2023 | Li | ......................... | G06F 1/1605 248/316.7 |
| 2013/0092805 A1 * | 4/2013 | Funk | ..................... | F16M 13/00 248/274.1 |

FOREIGN PATENT DOCUMENTS

| | | |
|---|---|---|
| CN | 110138905 A | 8/2019 |
| CN | 106061331 B | 2/2021 |
| CN | 215450487 U | 1/2022 |
| TW | 200638180 A | 11/2006 |
| TW | M517506 U | 2/2016 |

OTHER PUBLICATIONS

TW Office Action dated Apr. 14, 2023 issued in Taiwan application No. 111130869.

* cited by examiner

*Primary Examiner* — Sherman Ng
(74) *Attorney, Agent, or Firm* — McClure, Qualey & Rodack, LLP

(57) ABSTRACT

A base mechanism is adapted for a function module and an device main part and includes a mount and a connecting component, the mount is partially disposed in the device main part, the connecting component is connected to the function module and movably disposed on the mount, and the function module is movable with respect to the mount via the connecting component.

11 Claims, 13 Drawing Sheets

BASE MECHANISM AND PERIPHERAL ASSEMBLY AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 202210865848.5 filed in China on Jul. 22, 2022, the entire contents of which are hereby incorporated by reference.

TECHNICAL FIELD

The disclosure relates to a mount, more particularly relates to a base mechanism which is able to adjust angle of a function module and a peripheral assembly and an electronic device including the same.

BACKGROUND

In recent years, video cameras have been widely used in video conferences, live broadcast, remote video teaching, and other occasions, thus they become an indispensable part of computers or TV screens and have gradually changed people's work and lifestyle.

Typically, the camera lens is arranged in the front bezel of a TV, computer, tablet, or smartphone screen and receives light via a punch-hole on the front bezel, thus the viewing angle is not adjustable and thereby bring inconvenience to viewers.

SUMMARY

Accordingly, one aspect of the disclosure is to provide a base mechanism and a peripheral assembly and an electronic device including the same which are capable of adjusting an angle of a function module.

One embodiment of the disclosure provides a peripheral assembly, adapted for a device main part, including a function module; and a base mechanism, the base mechanism includes a mount partially disposed in the device main part and a connecting component connected to the function module and movably disposed on the mount, and the function module is movable with respect to the mount via the connecting component.

Another embodiment of the disclosure provides an electronic device including a device main part and a peripheral assembly, the peripheral assembly includes a function module and a base mechanism including a mount being partially disposed in the main part and a connecting component connected to the function module and movably disposed on the mount, and the function module is movable with respect to the mount via the connecting component.

Another embodiment of the disclosure provides a base mechanism adapted for a function module and a device main part and including a mount and a connecting component, the mount is partially disposed in the device main part, the connecting component is connected to the function module and movably disposed on the mount, and the function module is movable with respect to the mount via the connecting component.

According to the base mechanism, the peripheral assembly, and the electronic device as discussed in the above embodiments of the disclosure, the connecting component configured for being connectable to the function module is able to make the function module movable relative to the mount and therefore enable position or angle adjustment of the function module as required.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities. Unless specified or limited otherwise, the terms "mounted", "connected", "disposed", "fixed", and variations thereof are used broadly and encompass both direct and indirect mounting, connection, disposing, and fixing.

Figure 1:
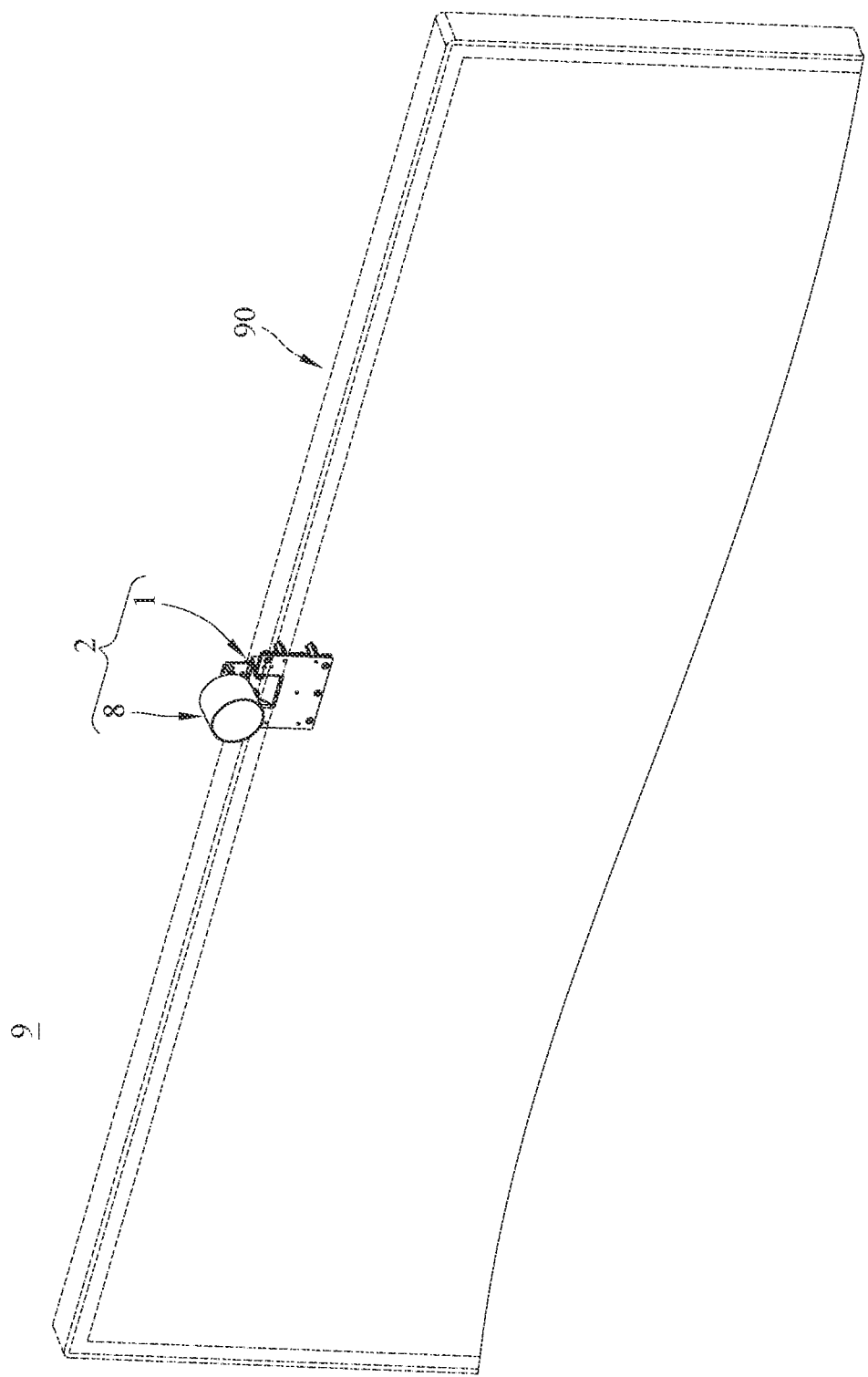
FIG. 1 is a partially enlarged view of an electronic device according to one embodiment of the disclosure.
Figure 2:
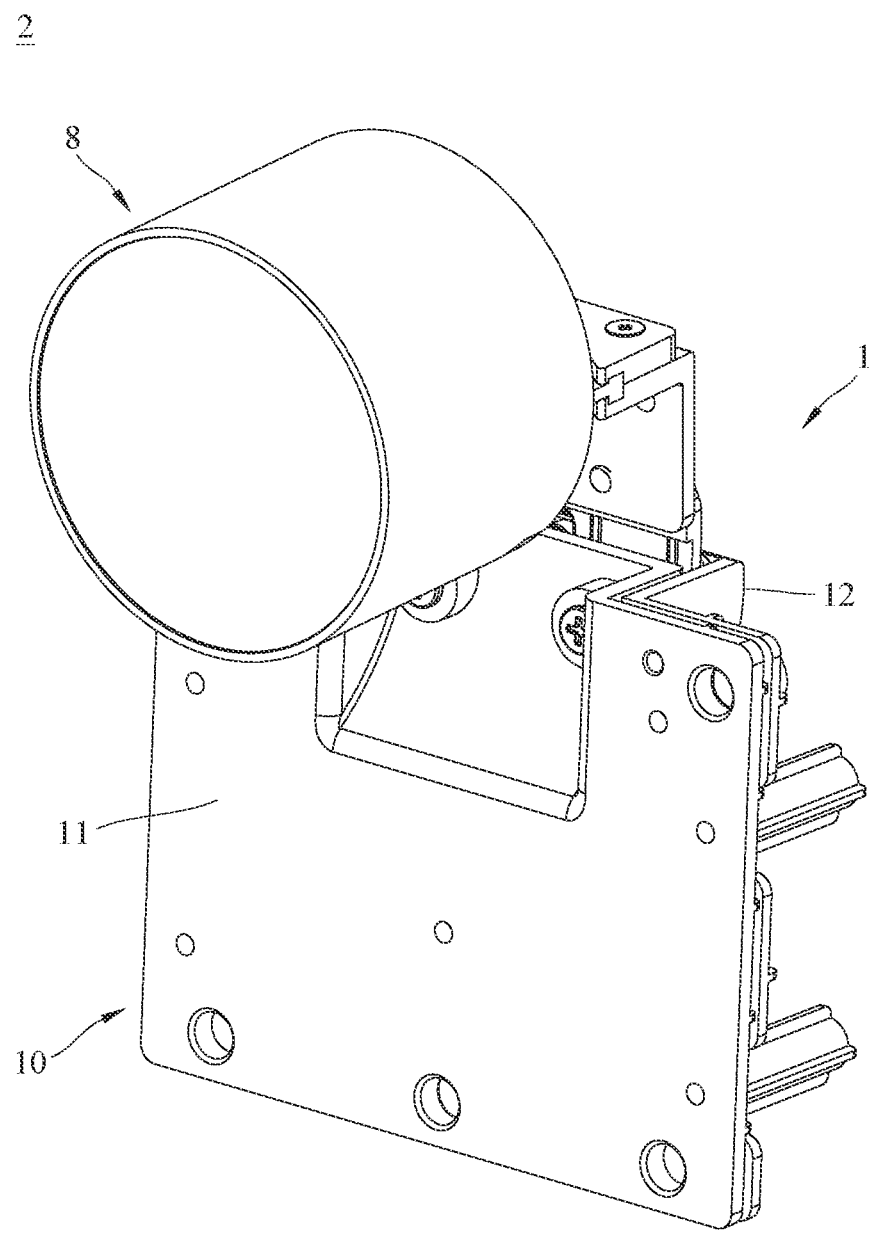
FIGS. 2-3 are perspective views of a peripheral assembly in FIG. 1, taken from different angles.

Referring to FIG. 1, one embodiment of the disclosure provides an electronic device 9 which may include a device main part 90 and a base mechanism 1 configured to be arranged at a side of the device main part 90. In some embodiments, the electronic device 9 may be, but is not limited to be, a TV, laptop computer, desktop computer, or part thereof. In some embodiments, there may be a display panel disposed on the device main part 90 to be employed as a display or screen of the electronic device 9; however, it is noted that the electronic device 9 and its device main part 90 are exemplary for better understanding the base mechanism 1 but are not intended to limit the disclosure in any aspect. In some other embodiments, the electronic device 9 is, for example, a smartphone, tablet, or projector.

In addition, in this embodiment, there may be a function module 8 disposed on the base mechanism 1, the function module 8 is disposed on the device main part 90 via the base mechanism 1 and the base mechanism 1 makes the angle of the function module 8 relative to the device main part 90 adjustable as required. The function module 8 may be, but is not limited to, any relatively small size device suitable to be equipped on the device main part 90, such as an audio module, infrared sensor, or webcam. As shown, the function module 8 and the base mechanism 1 may together form a peripheral assembly 2. It is noted that the disclosure is not limited by the function module and function thereof.

The detail of the base mechanism 1 will be described below with reference to FIG. 2-5. In this embodiment, the base mechanism 1 may include a mount 10, a movable member 20, and a connecting component 30. The mount 10 means the part of the base mechanism 1 used to be fixed on the device main part 90 of the electronic device 9. The connecting component 30 means the part of the base mechanism 1 used to be connected to the function module 8 and movable relative to the mount 10. The movable member 20 means the part of the base mechanism 1 used to be connected to the connecting component 30 and movably disposed on the mount 10. In other words, the base mechanism 1 is disposed on the device main part 90 of the electronic device 9 via the mount 10, the connecting component 30 is movably disposed on the mount 10 via the movable member 20 so that the function module 8 on the connecting component 30 is movable relative to the device main part 90 to adjust its angle and position.

In this embodiment, the mount 10 may include a first frame component 11 and a second frame component 12. Optionally, the first frame component 11 may be fixed to the second frame component 12 and/or the device main part 90 using means, such as, screw, bolt, adhesive, welding, or another suitable engaging mechanism. The second frame component 12 may be clamped by the first frame component 11 and the device main part 90. The second frame component 12 may be fixed to the device main part 90 using means, such as, screw, bolt, adhesive, welding, or another suitable engaging mechanism, but the disclosure is not limited thereto; in other embodiments, the second frame component 12 may be integrally formed with the device main part 90.

In this embodiment, part of the movable member 20 is movably disposed between the first frame component 11 and the second frame component 12. As described in more detail below, the first frame component 11 may have a guiding portion 111, the second frame component 12 may have a guiding portion 121, the movable member 20 may include a first piece 21, and the first piece 21 may have a mating portion 211. The mating portion 211 may be located between the guiding portion 111 and the guiding portion 121. The guiding portion 111 and the guiding portion 121 are respectively parts of the first frame component 11 and the second frame component 12 used to clamp and guide the mating portion 211 of the first piece 21. Also, the mating portion 211, the guiding portion 111, and the guiding portion 121 may have mating profiles. For example, the guiding portion 111, the guiding portion 121, and the mating portion 211 may be curved surfaces having the substantially the same curvature; in specific, the guiding portion 111, the guiding portion 121, and the mating portion 211 of the first piece 21 may be formed about the same axis (e.g., X axis). As such, the mating portion 211 may match the guiding portion 111 and the guiding portion 121 in shape and therefore is movable between the guiding portion 111 and the guiding portion 121. In such an arrangement, the movable member 20 is movable about the axis in which the guiding portion 111 and the guiding portion 121 are formed about.

Optionally, in this embodiment, the mating portion 211 of the first piece 21 may have one or more through slots 2111, there may be one or more protrusions 1211 formed on the guiding portion 121 of the second frame component 12. As shown, the through slot 2111 may be curved slots formed about an axis (e.g., X axis), the protrusions 1211 extends towards the first frame component 11 (e.g., extending in Y axis) and are slidably disposed through some of the through slots 2111, thus the movable member 20 is movable about an axis relative to the mount 10. In one embodiment, the mating portion 211 may have three through slots 2111, and the protrusions 1211 may be slidably disposed through the two outermost through slots 2111, respectively.

Optionally, in this embodiment, the base mechanism 1 may further include a stabilizing member 40 configured to be arranged between the first frame component 11 and the second frame component 12. For example, the stabilizing member 40 may be clamped by the mating portion 211 of the first piece 21 and the first frame component 11 or the second frame component 12 of the mount 10. More specifically, the stabilizing member 40 may be arranged between the mating portion 211 of the first piece 21 and the guiding portion 121 of the second frame component 12 to stabilize the motion of the mating portion 211 relative to the mount 10.

Specifically, the stabilizing member 40 may be fixed to the guiding portion 121 of the second frame component 12 using, for example, screws or bolts (not numbered), the stabilizing member 40 may include one or more press bumps 41 extending towards the mating portion 211 of the first piece 21 and used to contact the mating portion 211 of the first piece 21. In such an arrangement, the press bumps 41 of the stabilizing member 40 are able to apply pressure to the mating portion 211 of the first piece 21; in other words, the mating portion 211 of the first piece 21 may be againsted and pressed by the press bump to increase the friction while the mating portion 211 is sliding, thereby stabilizing the motion of the movable member 20 relative to the mount 10. Further, the contact force between the press bumps 41 of the stabilizing member 40 and the mating portion 211 of the first piece 21 is adjustable by tightening or loosening screw or bolt on the stabilizing member 40 and thereby adjusting frictions between the movable member 20 and the mount 10.

Optionally, the stabilizing member 40 may have at least one guide protrusion 42 slidably through one of the through slots 2111 of the mating portion 211 to stabilize the position of the first piece 21 relative to the stabilizing member 40. In specific, in one embodiment, a guide protrusion 42 is slidably through the middle one of the through slots 2111 while the protrusions 1211 are slidably disposed through the outermost through slots 2111.

As described in more detail below, the first piece 21 may further have a guide groove portion 213, the connecting component 30 may have a mating portion 31, the guide groove portion 213 may be a curved groove formed about an axis (e.g., Z axis) which is perpendicular to an axis (e.g., X axis) which the movable member 20 is movable about relative to the mount 10; in other words, the guide groove portion 213 may be formed about an axis being perpendicular to an axis for a path of the movable member 20 moves relatively to the mount 10. The mating portion 31 may be a curved protrusion mating the guide groove portion 213 and slidably disposed on the guide groove portion 213. In such an arrangement, the connecting component 30 and the function module 8 thereon may be movable relative to the movable member 20 about an axis (e.g., Z axis) which is perpendicular to an axis (e.g., X axis) which the movable member 20 is movable about relative to the mount 10; in other words, an axis for a path of the connecting component 30 and the function module 8 move relatively to the movable member 20 is perpendicular to an axis for the movable member 20 moves relatively to the mount 10.

Optionally, the movable member 20 may further include a second piece 22 fixed to the first piece 21 using means, such as, screw, bolt, adhesive, welding, or another suitable engaging mechanism. The second piece 22 may cover the guide groove portion 213 of the first piece 21 to prevent the mating portion 31 of the connecting component 30 from falling off from the guide groove portion 213. In the case that the second piece 22 is fixed to the first piece 21 using a screw or bolt, the clamping force that the second piece 22 and the first piece 21 acts on the mating portion 31 of the connecting component 30 can be adjusted by tightening or loosening the screw or bolt and thereby adjusting frictions between the connecting component 30 and the movable member 20.

Figure 3:
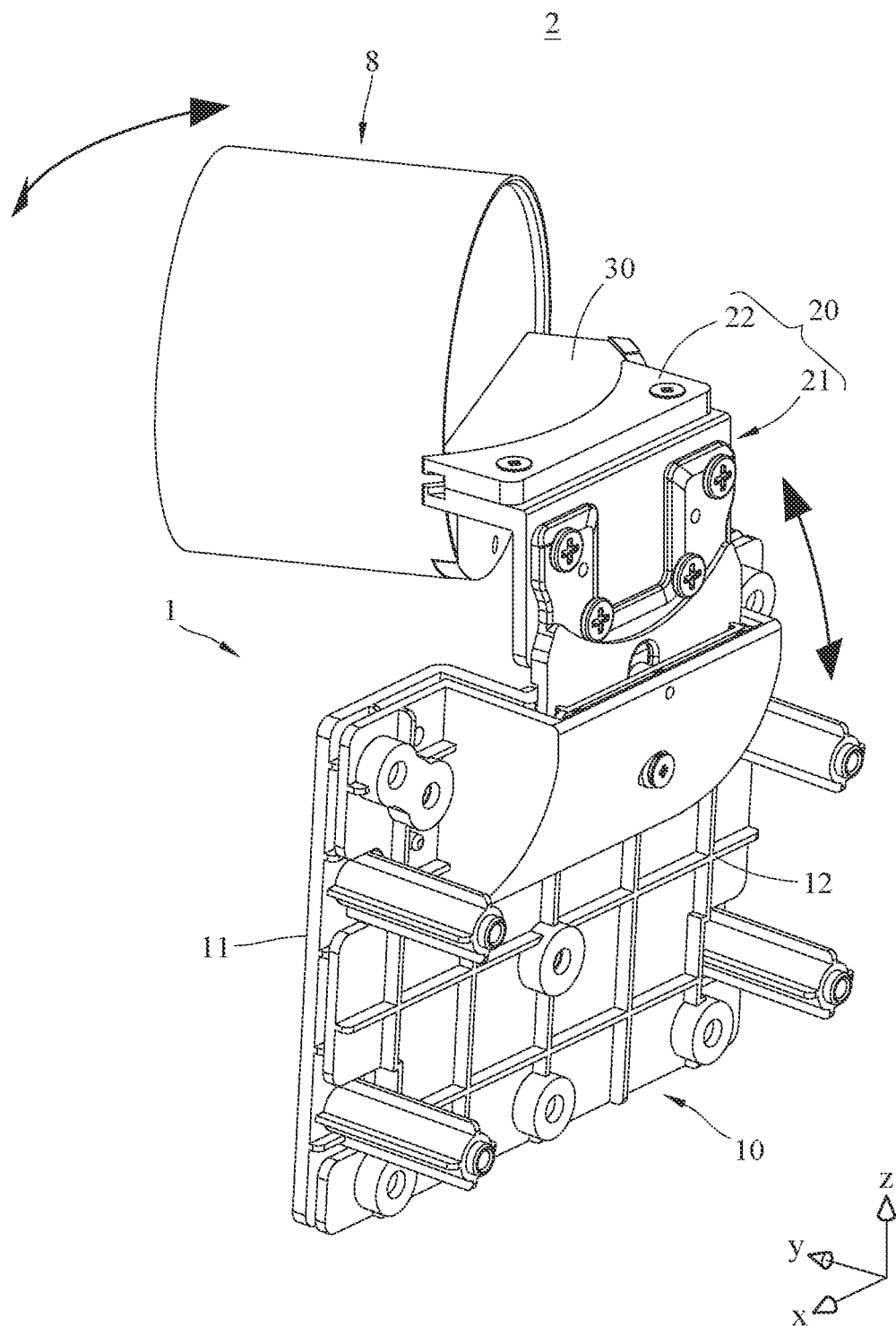
Figure 4:
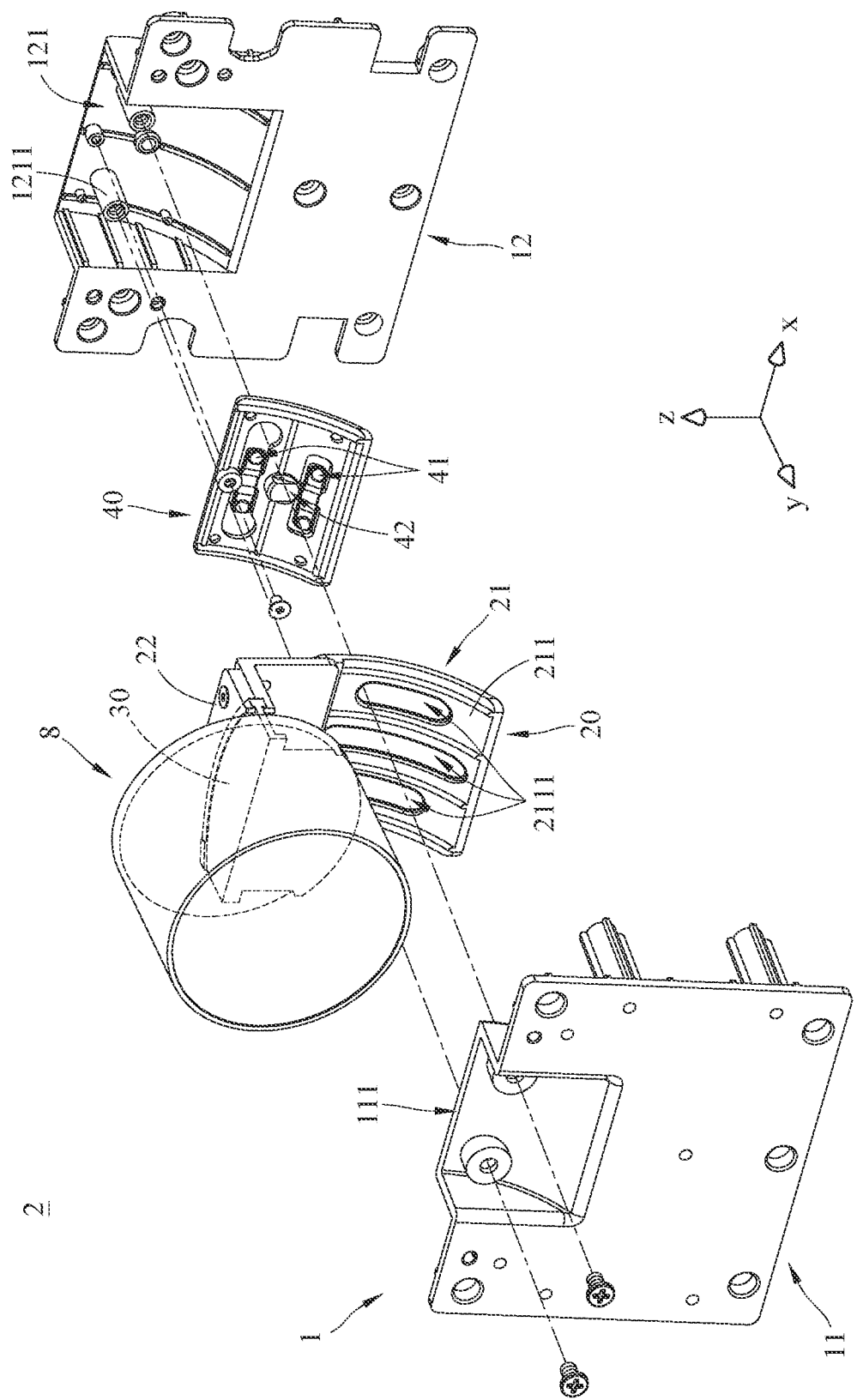
FIG. 4 is an exploded view of the peripheral assembly in FIG. 2.
Figure 5:
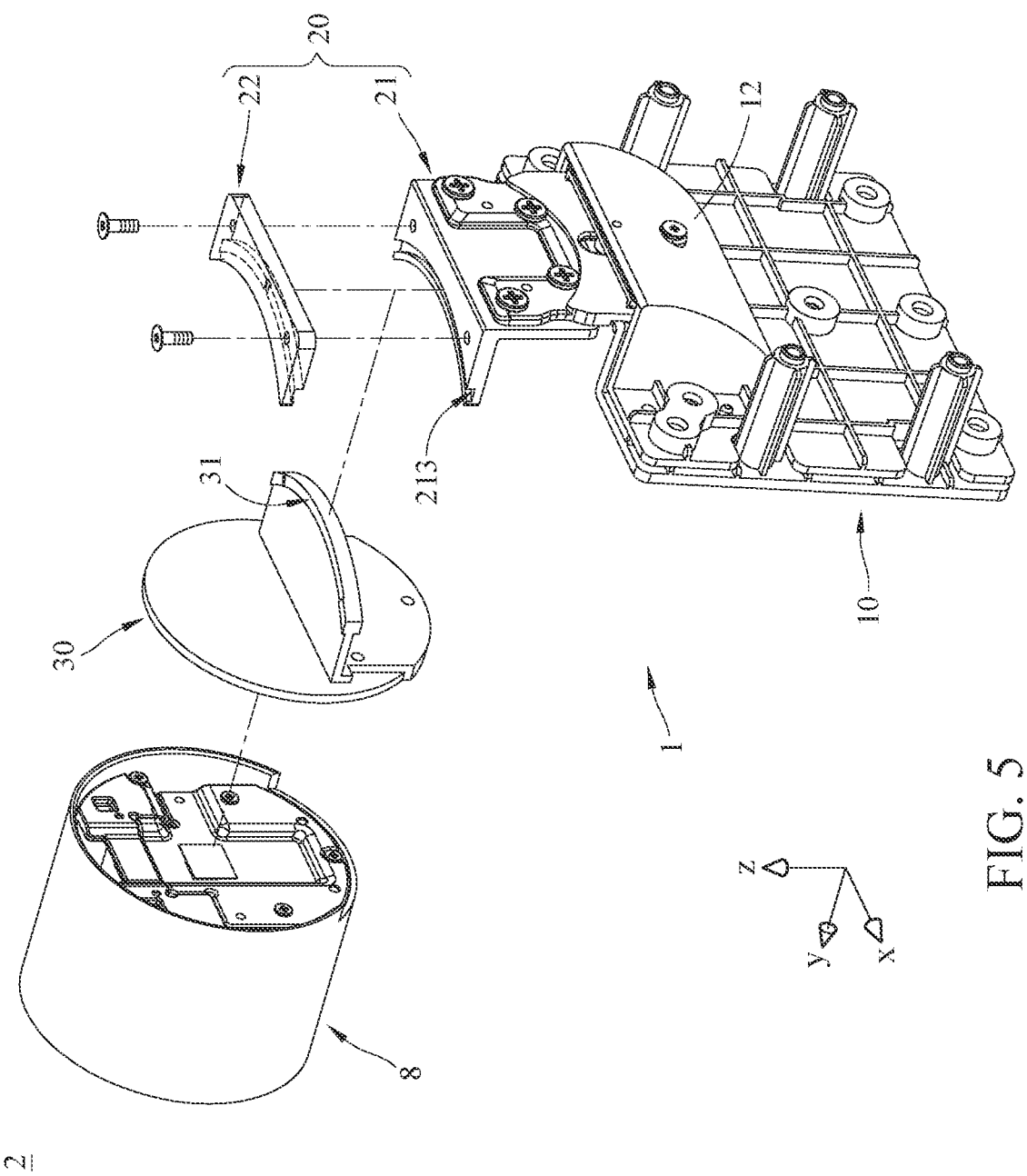
FIG. 5 is an exploded view of the peripheral assembly in FIG. 3.

As such, as the directions indicated by arrows shown in FIG. 3, due to the above arrangement of the base mechanism 1, the function module 8 is movable in upwards, downwards, leftwards, rightwards directions relative to the mount 10; in other words, the movable member 20 is movable relative to the mount 10 about an axis (e.g., X axis) perpendicular to an axis (e.g., Z axis) in which the connecting component 30 is movable about the movable member 20. That is, an axis for the movable member 20 moves relatively to the mount 10 is perpendicular to an axis for the connecting component 30 moves relatively to the movable member 20. Accordingly, the base mechanism 1 allows the function module 8 to be adjusted to the required angle or direction relative to the device main part 90 of the electronic device 9.

It is noted that the previous base mechanisms are exemplary embodiments of the disclosure but are not intended to limit the disclosure. It is also noted that the base mechanism can be modified according to actual requirements. The following provides other exemplary base mechanisms of the disclosure which are all capable of realizing angle and direction adjustment of function module, but for the purpose of simplicity, only the main differences between the introduced embodiment and the previous embodiments will be described in detail, and the same or similar parts can be comprehended with reference to the corresponding paragraphs and thus will not be repeatedly described hereinafter. It is also noted that the same reference number denote the same component or element.

Figure 6:
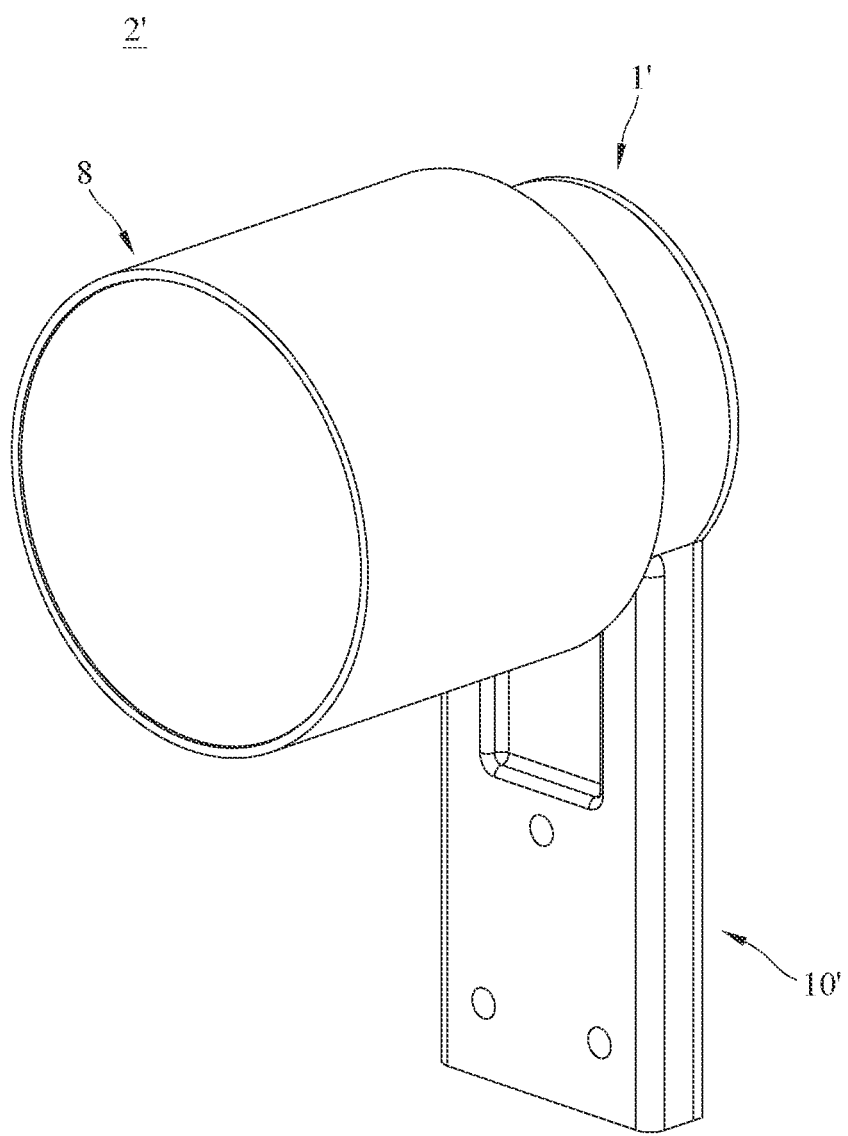
FIG. 6 is a perspective view of a peripheral assembly according to another embodiment of the disclosure.
Figure 7:
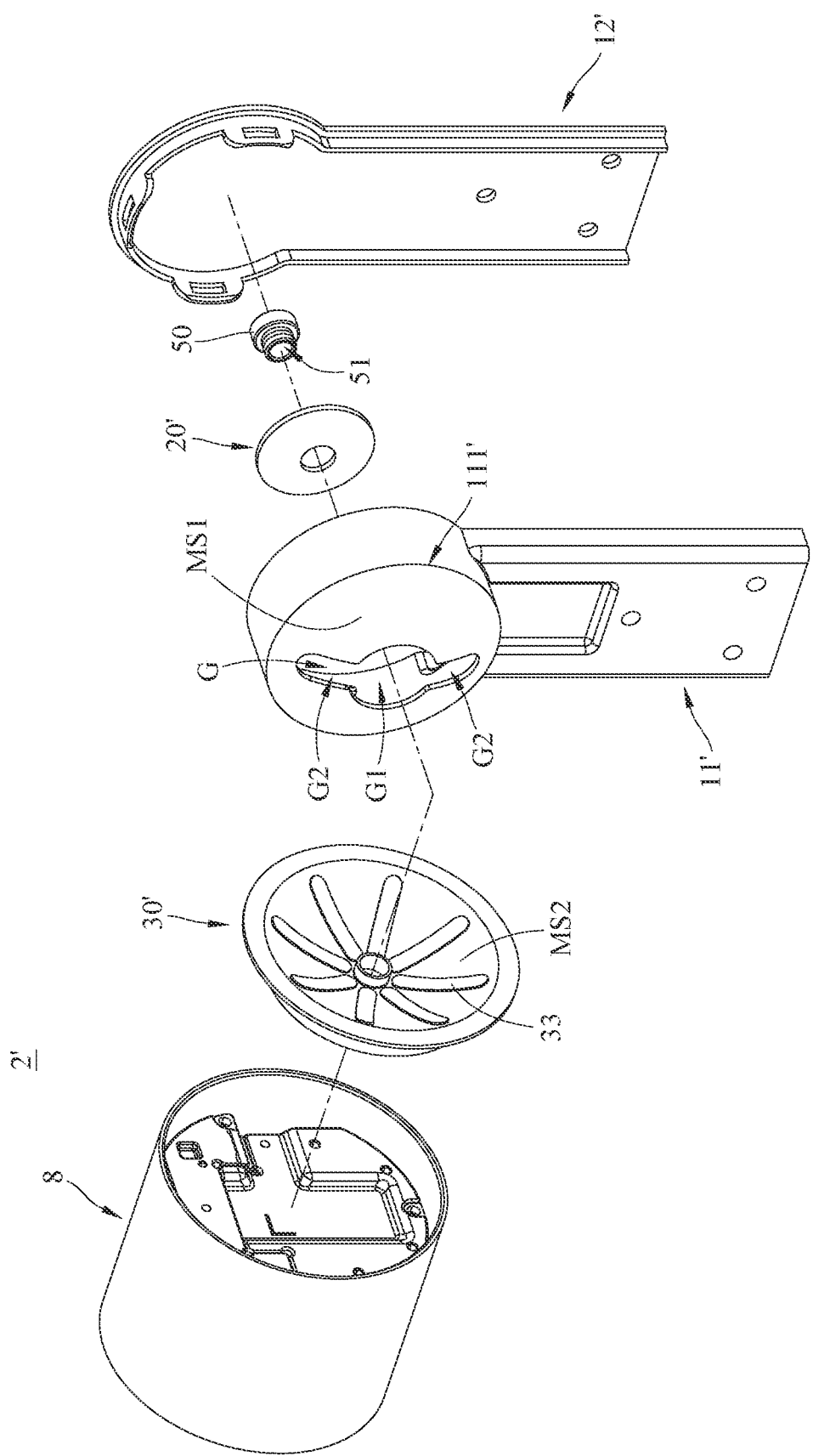
FIG. 7 is an exploded view of the peripheral assembly in FIG. 6.
Figure 8:
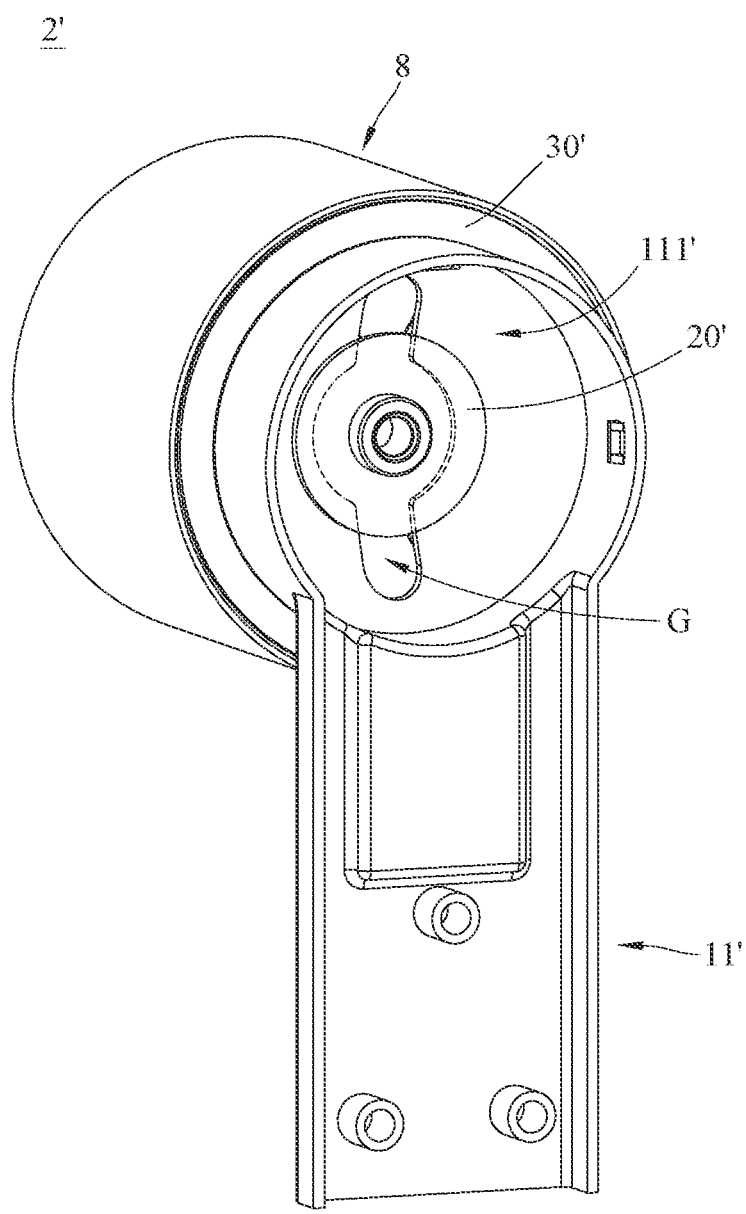
FIG. 8 is a perspective view of the peripheral assembly in FIG. 6, taken from another angle.

Please refer to FIGS. 6-8, another embodiment of the disclosure provides a peripheral assembly 2', where FIG. 6 is a perspective view of a peripheral assembly 2', FIG. 7 is an exploded view of the peripheral assembly 2', and FIG. 8 is a perspective view of the peripheral assembly 2' taken from another angle. As shown, in a base mechanism 1' of the peripheral assembly 2', a guiding portion 111' of a first frame component 11' of a mount 10' has a curved surface being part of a spherical profile, and the connecting component 30' also has a curved surface being part of a spherical profile so as to be mating the guiding portion 111' in shape.

Specifically, the mount 10' may have a first mating surface MS1, the first mating surface MS1 may be located at a side of the guiding portion 111' facing towards the connecting component 30', the connecting component 30' may have a second mating surface MS2, the second mating surface MS2 may be located at a side of the connecting component 30', facing towards the guiding portion 111', one of the first mating surface MS1 and the second mating surface MS2 may be a convex curved surface while the other is a mating concave surface; that is, the guiding portion 111' of the first frame component 11' and the side of the connecting component 30' located close to the guiding portion 111' have matching profiles. In more details, the mount 10' may have a guide slot G, the guide slot G may be located at the first mating surface MS1. The guide slot G is, for example, an elongated through hole whose central portion is wider than the rest portion. Specifically, the guide slot G may include a first slot portion G1 and two second slot portions G2, the first slot portion G1 is located between and connected to the second slot portions G2, the first slot portion G1 is wider than the second slot portions G2 in a horizontal direction. It is noted that the shapes of the first slot portion G1 and the second slot portions G2 on the first mating surface MS1 may be modified according to the required movable path the function module 8.

The movable member 20' may be fixed to the connecting component 30' and is movably disposed on the guiding portion 111' of the first frame component 11'. Specifically, in this embodiment, the movable member 20' may be an integrally formed single piece and may be arranged at a side (or, inner side) of the guiding portion 111' located away from the connecting component 30', and the movable member 20' may be fixed to the connecting component 30' using means, such as, screw, bolt, adhesive, welding, or another suitable engaging mechanism through the guide slot G. The movable member 20' and the connecting component 30' are larger than the first slot portion G1 and the second slot portions G2 of the guide slot G in horizontal direction, thus the connecting component 30' being fixed to the movable member 20' through the guide slot G is only movable along the guide slot G.

In such an arrangement of the base mechanism 1' discussed above, the guiding portion 111' of the first frame component 11' is partially clamped by the connecting component 30' and the movable member 20'. In the case that the movable member 20' is fixed to the connecting component 30' using a screw or bolt (e.g., a fastener 50 as shown) disposed through the guide slot G, the clamping force that the movable member 20' and the connecting component 30' acts on the guiding portion 111' of the first frame component 11' can be adjusted by tightening or loosening the fastener 50; that is, the friction between the first mating surface MS1 of the guiding portion 111' and the second mating surface MS2 of the connecting component 30 may be adjusted by the fastener 50.

Optionally, the connecting component 30' may have one or more protruding portion 33 protruding from the second mating surface MS2 to contact the guiding portion 111', such that the overall contact area between the connecting component 30' and the first frame component 11' is decreased to facilitate the motion of the connecting component 30' relative to the guiding portion 111'.

Figure 9:
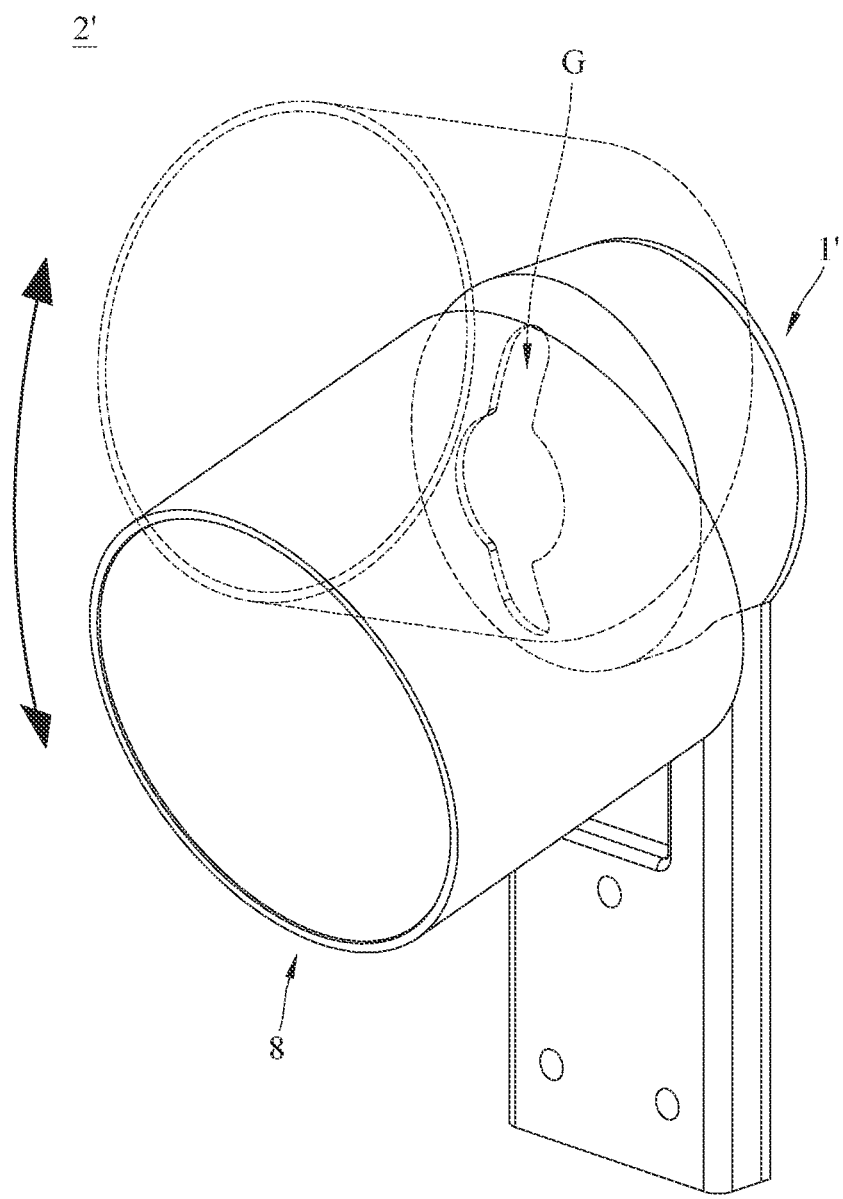
FIGS. 9-10 depicts the operation of the peripheral assembly in FIG. 6.
Figure 10:
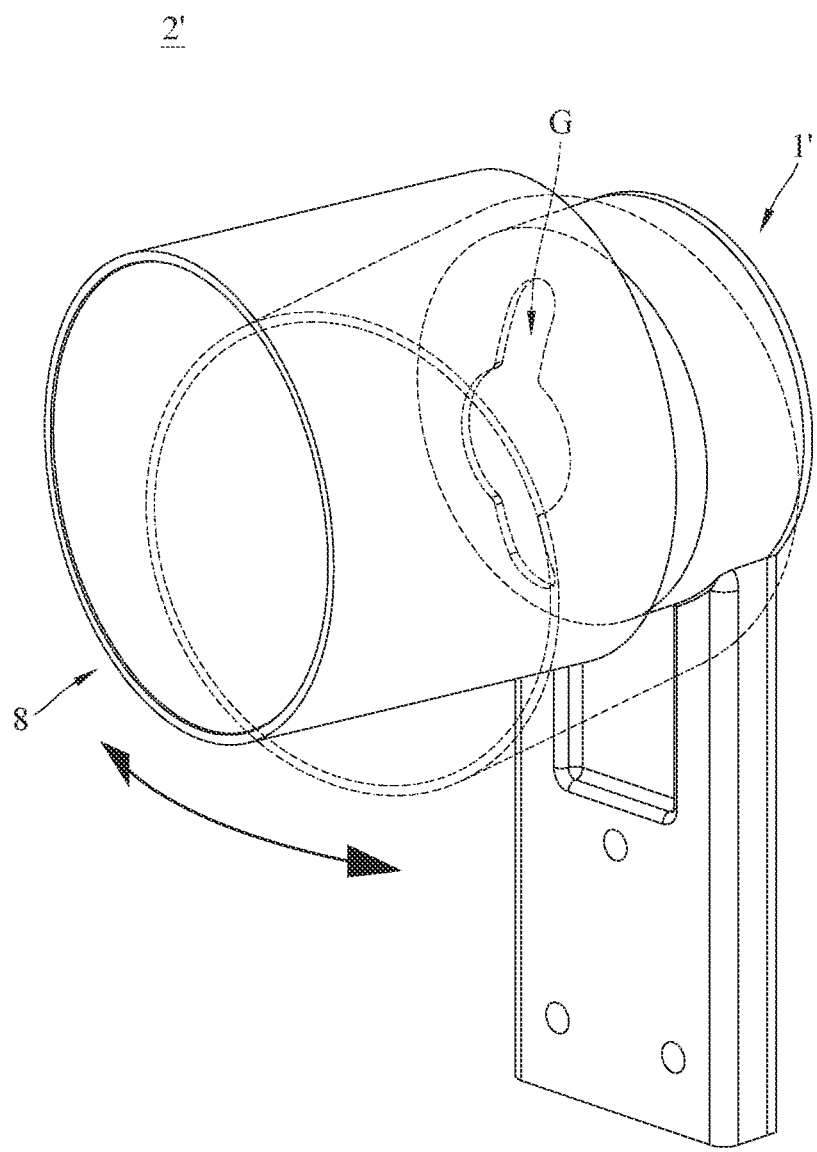

As such, with the cooperation of the movable member 20', the connecting component 30', and the guiding portion 111' of the mount 10', the angle or direction of the function module 8 relative to the mount 10' is adjustable as required. Please see the directions indicated by the arrows shown in FIGS. 9-10, due to the above arrangement of the base mechanism 1', the function module 8 is movable in upwards, downwards, leftwards, rightwards directions, realizing adjustment in any required angle or orientation of the function module 8.

Optionally, the fastener 50 may have a cable hole 51 configured for guiding one or more cables (not shown) coming from the function module 8 to pass through the connecting component 30', the guiding portion 111', and the movable member 20'.

Figure 11:
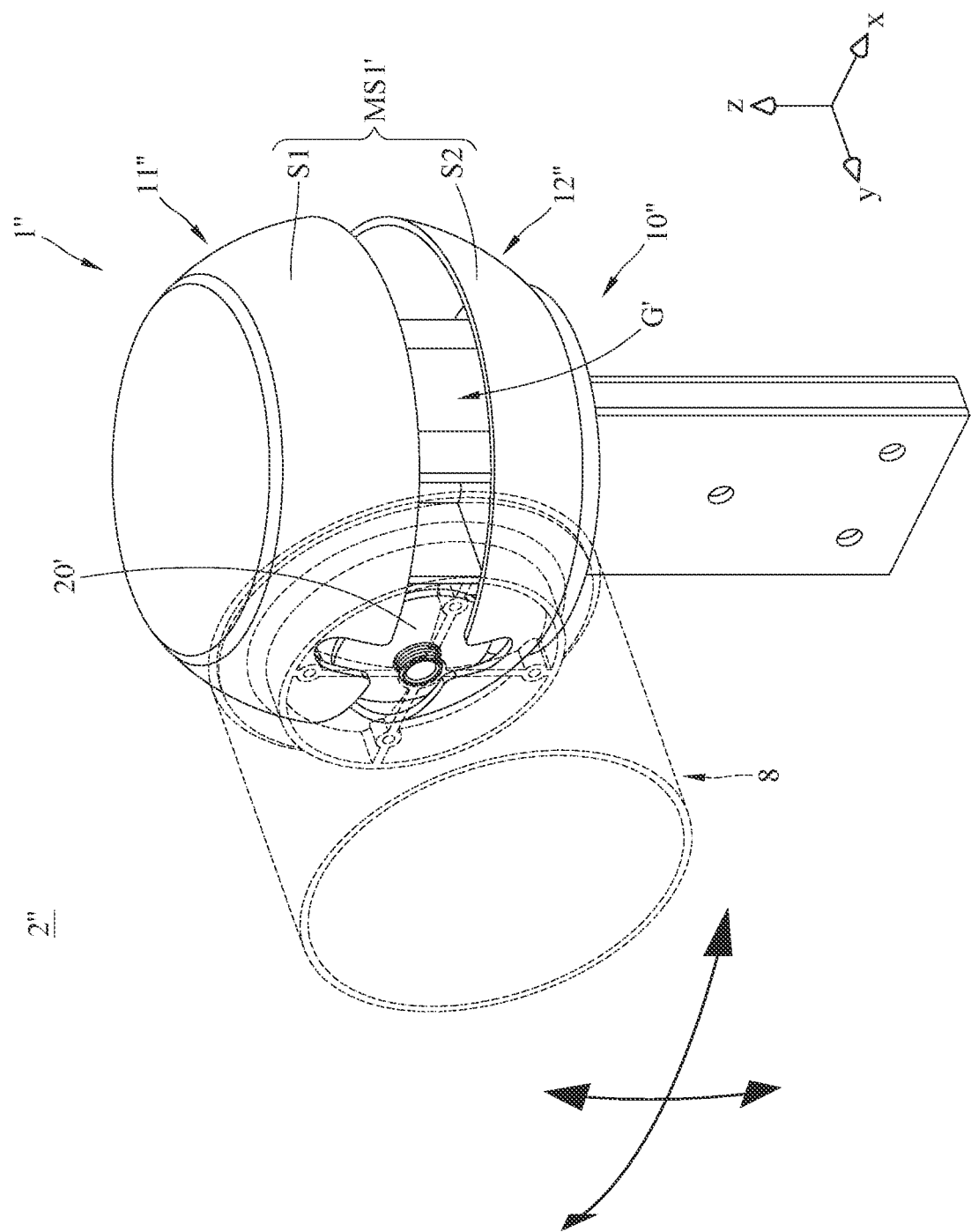
FIG. 11 is a perspective view of a peripheral assembly according to another embodiment of the disclosure.
Figure 12:
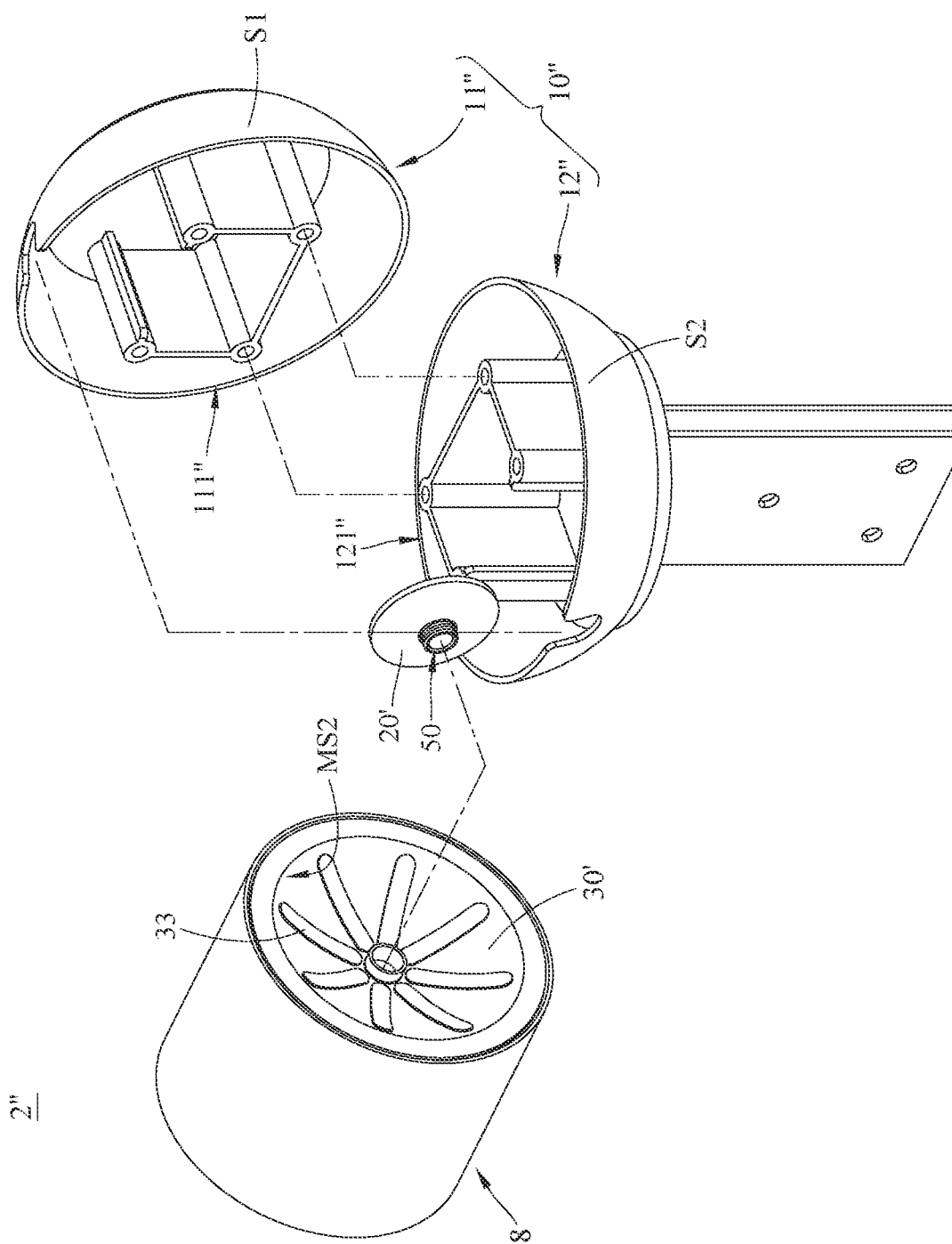
FIG. 12 is an exploded view of the peripheral assembly in FIG. 11.

Please refer to FIGS. 11-12, another embodiment of the disclosure provides a peripheral assembly 2". As shown, in a base mechanism 1" of the peripheral assembly 2", a guiding portion 111" of a first frame component 11" of a mount 10" and a guiding portion 121" of a second frame component 12" may each be a curved surface being part of a spherical profile and therefore may together form a profile mating the second mating surface MS2 of the connecting component 30'.

Specifically, the guiding portion 111" may have a first curved surface S1, the guiding portion 121" may have a second curved surface S2, the first curved surface S1 and the second curved surface S2 may be two curved surfaces separated from each other and formed about the same axis (e.g., Z axis) to form the first mating surface MS1' of the mount 10" which mates the second mating surface MS2 of the connecting component 30'. In such an arrangement, a guide slot G' of the mount 10" may be the gap between the first curved surface S1 and the second curved surface S2, in other words, the first curved surface S1 and the second curved surface S2 are spaced by the guide slot G'; that is, the guide slot G' is a annular slot formed about the axis (e.g., Z axis) in which the first curved surface S1 and the second curved surface S2 are formed about.

Thus, the movable member 20' may be fixed to the connecting component 30' using means, such as, screw, bolt, adhesive, welding, or another suitable engaging mechanism through the guide slot G'. As such, please see the directions indicated by the arrows shown in FIG. 11, the function module 8 is movable in upwards, downwards, leftwards, rightwards directions relative to the mount 10", realizing adjustment in any required angle or orientation of the function module 8 relative to the mount 10".

Figure 13:
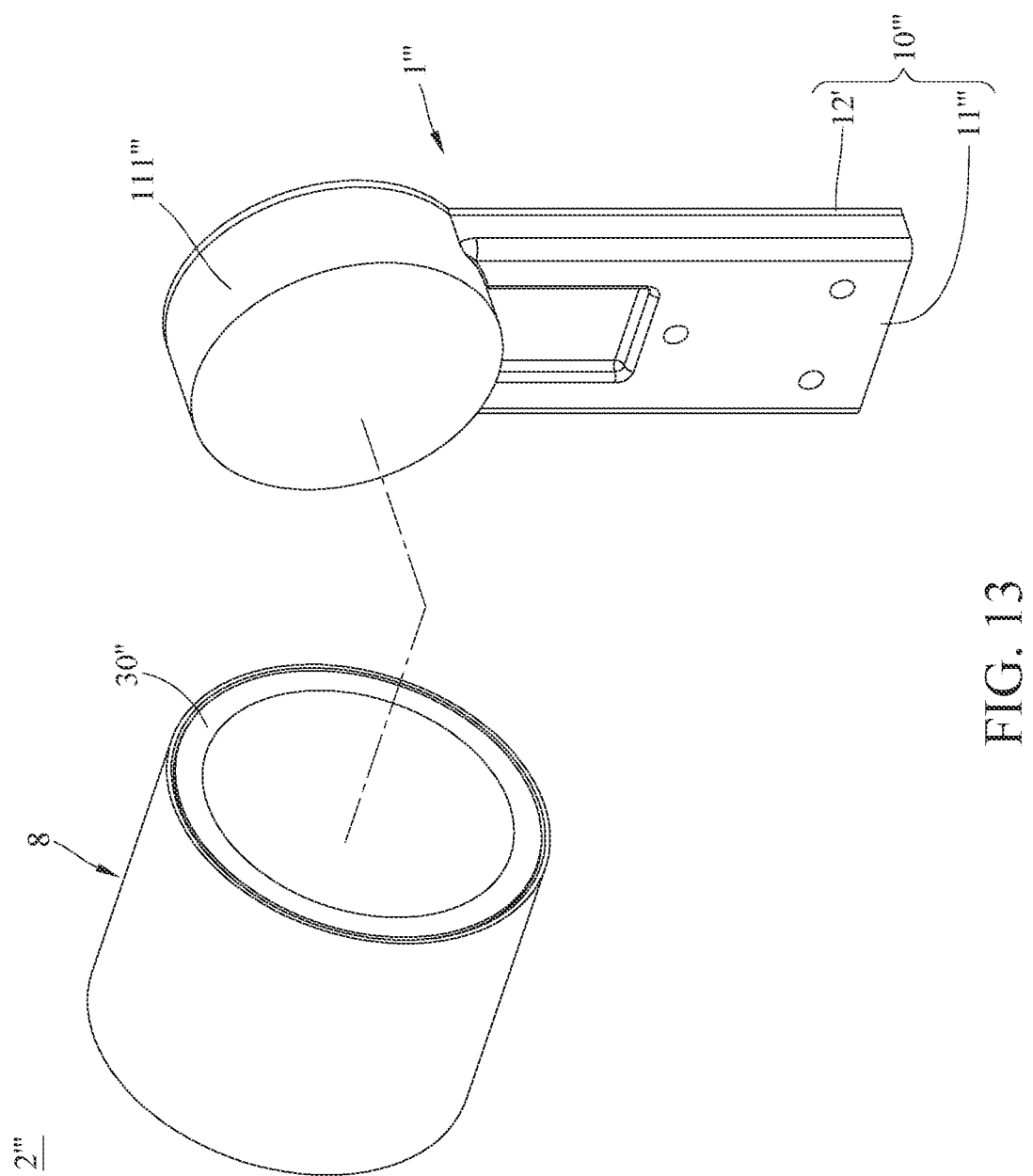
FIG. 13 is an exploded view of a peripheral assembly according to another embodiment of the disclosure.

Please refer to FIG. 13, another embodiment of the disclosure provides a peripheral assembly 2'''. As shown, in a base mechanism 1''' of the peripheral assembly 2''', a guiding portion 111''' of a first frame component 11''' of a mount 10''' has a profile mating the connecting component 30'' but is absent of the guide slot discussed in previous embodiments. The guiding portion 111''' and the connecting component 30'' are magnetically attracted to each other. Thus, the connecting component 30'' is movable in multiple directions on the mount 10''' and can be kept in the required angle and direction relative to the mount 10''' by the magnetic force between the guiding portion 111''' and the connecting component 30''.

It is noted that any previous embodiments may be adopted to other embodiments as required. For example, in some other embodiments, the magnetic materials may be applied to the connecting component and the mount to increase the clamping force that the movable member and the connecting component act on the guiding portion of the mount. In some embodiments, the guide slot on the first mating surface of the mount may be an inclined slot or a wave-shaped slot to realize the required motion of the function module.

According to the base mechanism and the peripheral assembly and the electronic device including the same as discussed in the above embodiments of the disclosure, the connecting component configured for being connectable to the function module is able to make the function module movable relative to the mount and therefore enable position or angle adjustment of the function module as required.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A peripheral assembly, adapted for a device main part, comprising:
 a function module; and
 a base mechanism, comprising:
  a mount being partially disposed in the device main part; and
  a connecting component connected to the function module and movably disposed on the mount, and the function module being movable with respect to the mount via the connecting component;
 wherein the base mechanism further comprises a movable member movably disposed on the mount, the connecting component is movably disposed on the movable member and is connected to the mount via the movable member; and
 wherein the mount comprises a first frame component and a second frame component, the first frame component and the second frame component each has a guiding portion, the movable member comprises a first piece, the first piece comprises a mating portion, the mating portion mates the guiding portions of the first frame component and the second frame component in shape.

2. The peripheral assembly according to claim 1, wherein an axis for a path of the movable member moves relatively to the mount is perpendicular to an axis for a path of the connecting component moves relatively to the movable member.

3. The peripheral assembly according to claim 2, wherein the mating portion is movable between the guiding portion of the first frame component and the guiding portion of the second frame component.

4. The peripheral assembly according to claim 3, wherein the base mechanism further comprises a stabilizing member arranged between the mating portion of the first piece and the second frame component of the mount, the stabilizing member comprises a press bump protruding towards the mating portion of the first piece, and the mating portion is against and pressed by the press bump.

5. The peripheral assembly according to claim 4, wherein the stabilizing member further comprises a guide protrusion protruding from a surface of the stabilizing member facing towards the mating portion and slidably disposed through the mating portion.

6. An electronic device, comprising:
 a device main part; and
 a peripheral assembly, comprising:
  a function module; and a base mechanism, comprising:
  a mount being partially disposed in the main part; and
  a connecting component being connected to the function module and movably disposed on the mount, and the function module being movable with respect to the mount via the connecting component;
wherein the base mechanism further comprises a movable member movably disposed on the mount, the connecting component is movably disposed on the movable member and is connected to the mount via the movable member; and
wherein the mount comprises a first frame component and a second frame component, the first frame component and the second frame component each has a guiding portion, the movable member comprises a first piece, the first piece comprises a mating portion, the mating portion mates the guiding portions of the first frame component and the second frame component in shape.

7. The electronic device according to claim 6, wherein an axis for a path of the movable member moves relatively to the mount is perpendicular to an axis for a path of the connecting component moves relatively to the movable member.

8. The electronic device according to claim 7, wherein the mating portion is movable between the guiding portion of the first frame component and the guiding portion of the second frame component.

9. The electronic device according to claim 8, wherein the base mechanism further comprises a stabilizing member arranged between the mating portion of the first piece and the second frame component of the mount, the stabilizing member comprises a press bump protruding towards the mating portion of the first piece, and the mating portion is against and pressed by the press bump.

10. The electronic device according to claim 9, wherein the stabilizing member further comprises a guide protrusion, the guide protrusion protruding from a surface of the stabilizing member facing towards the mating portion and slidably disposed through the mating portion.

11. A base mechanism, adapted for a function module and a device main part, comprising:
  a mount being partially disposed in the device main part; and
  a connecting component connected to the function module and movably disposed on the mount, and the function module being movable with respect to the mount via the connecting component;
wherein the base mechanism further comprises a movable member movably disposed on the mount, the connecting component is movably disposed on the movable member and is connected to the mount via the movable member; and
wherein the mount comprises a first frame component and a second frame component, the first frame component and the second frame component each has a guiding portion, the movable member comprises a first piece, the first piece comprises a mating portion, the mating portion mates the guiding portions of the first frame component and the second frame component in shape.

* * * * *